United States Patent
Balasubramanian et al.

(10) Patent No.: US 10,244,629 B1
(45) Date of Patent: Mar. 26, 2019

(54) PRINTED CIRCUIT BOARD INCLUDING MULTI-DIAMETER VIAS

(71) Applicant: Innovium, Inc., San Jose, CA (US)

(72) Inventors: Vittal Balasubramanian, San Jose, CA (US); Yongming Xiong, Fremont, CA (US)

(73) Assignee: Innovium, Inc., San Jose, CA (US)

( * ) Notice: Subject to any disclaimer, the term of this patent is extended or adjusted under 35 U.S.C. 154(b) by 0 days.

(21) Appl. No.: 15/803,518

(22) Filed: Nov. 3, 2017

(51) Int. Cl.
  *H05K 1/11* (2006.01)
  *H05K 1/02* (2006.01)

(52) U.S. Cl.
  CPC .......... *H05K 1/113* (2013.01); *H05K 1/0298* (2013.01)

(58) Field of Classification Search
  CPC .................. H05K 1/113; H05K 1/115; H05K 2201/09709; H05K 1/114; H05K 1/0298
  USPC .................................................. 361/777, 760
  See application file for complete search history.

(56) References Cited

U.S. PATENT DOCUMENTS

| | | | | |
|---|---|---|---|---|
| 6,198,635 B1* | 3/2001 | Shenoy | ............. | H01L 23/49838 174/261 |
| 6,407,343 B1* | 6/2002 | Tanaka | ................ | H01L 23/5384 174/255 |
| 6,501,664 B1* | 12/2002 | Krieger | ................ | H05K 1/0231 257/724 |
| 2002/0027773 A1* | 3/2002 | Davidson | .............. | H01L 23/642 361/763 |
| 2004/0064942 A1* | 4/2004 | Chung | ................. | H05K 3/3436 29/840 |
| 2006/0083895 A1* | 4/2006 | Ikeda | ........................ | B32B 3/10 428/137 |
| 2008/0239683 A1* | 10/2008 | Brodsky | .............. | H05K 7/1069 361/760 |
| 2009/0045889 A1* | 2/2009 | Goergen | .............. | H05K 1/0216 333/175 |
| 2009/0200067 A1* | 8/2009 | Nozu | ................. | G01R 1/07378 174/255 |
| 2012/0167386 A1* | 7/2012 | Goergen | .............. | H05K 1/0216 29/852 |
| 2016/0150645 A1* | 5/2016 | Gailus | .................. | H05K 1/0222 174/266 |

* cited by examiner

*Primary Examiner* — Steven T Sawyer
(74) *Attorney, Agent, or Firm* — Fish & Richardson P.C.

(57) ABSTRACT

An apparatus that includes: a printed circuit board (PCB) that includes: a multilayer lamination of one or more ground layers, one or more power layers, and multiple signal layers; multiple vias that pass through one or more layers of the multilayer lamination, wherein a first via of the multiple vias includes: a first portion that has a first diameter, and a second portion that has a second diameter that is smaller than the first diameter, wherein a second via of the multiple vias includes: a third portion that has a third diameter, and a fourth portion that has a fourth diameter that is smaller from the third diameter; and wherein the first portion of the first via is adjacent to the fourth portion of the second via and the second portion of the first via is adjacent to the third portion of the second via is disclosed.

26 Claims, 14 Drawing Sheets

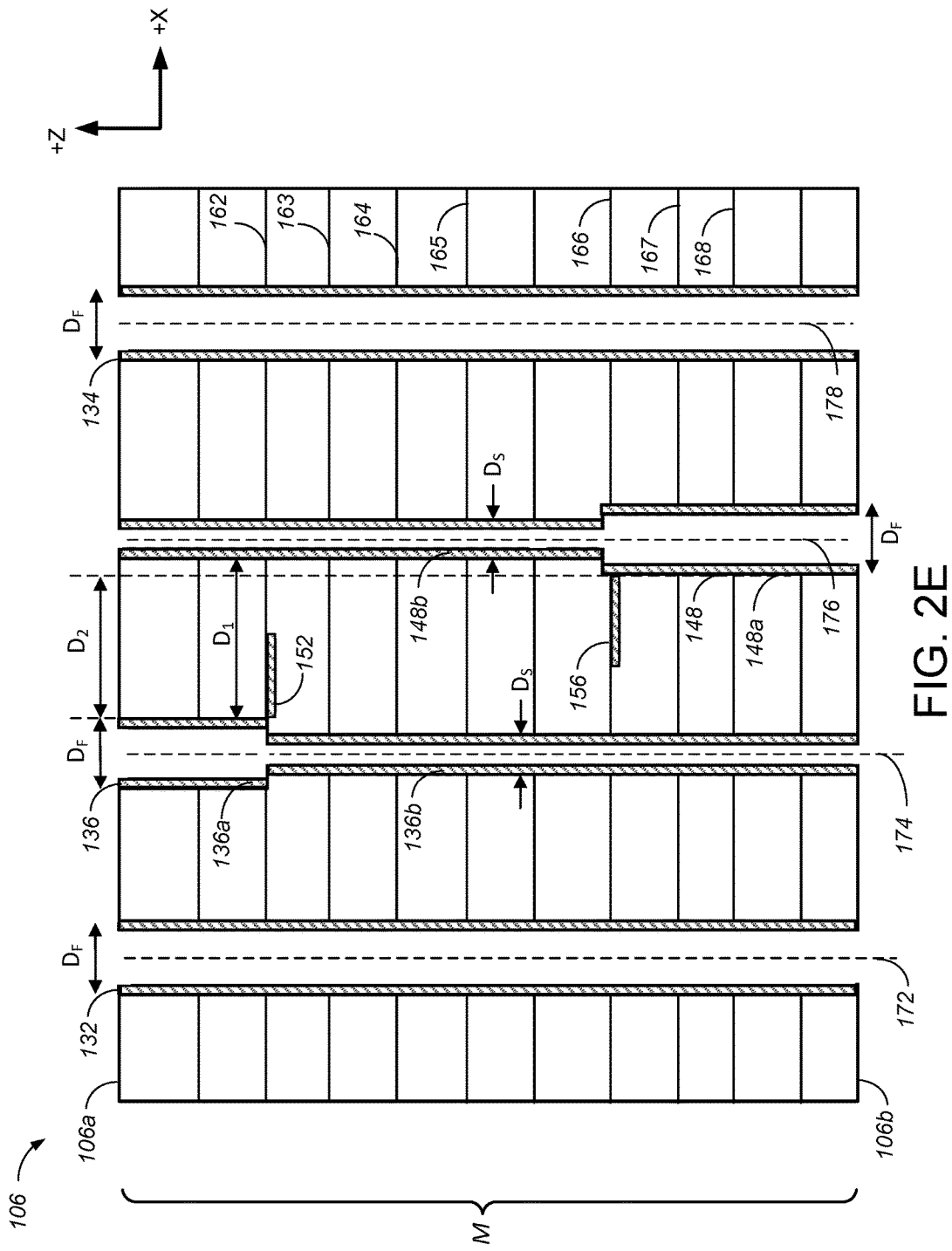

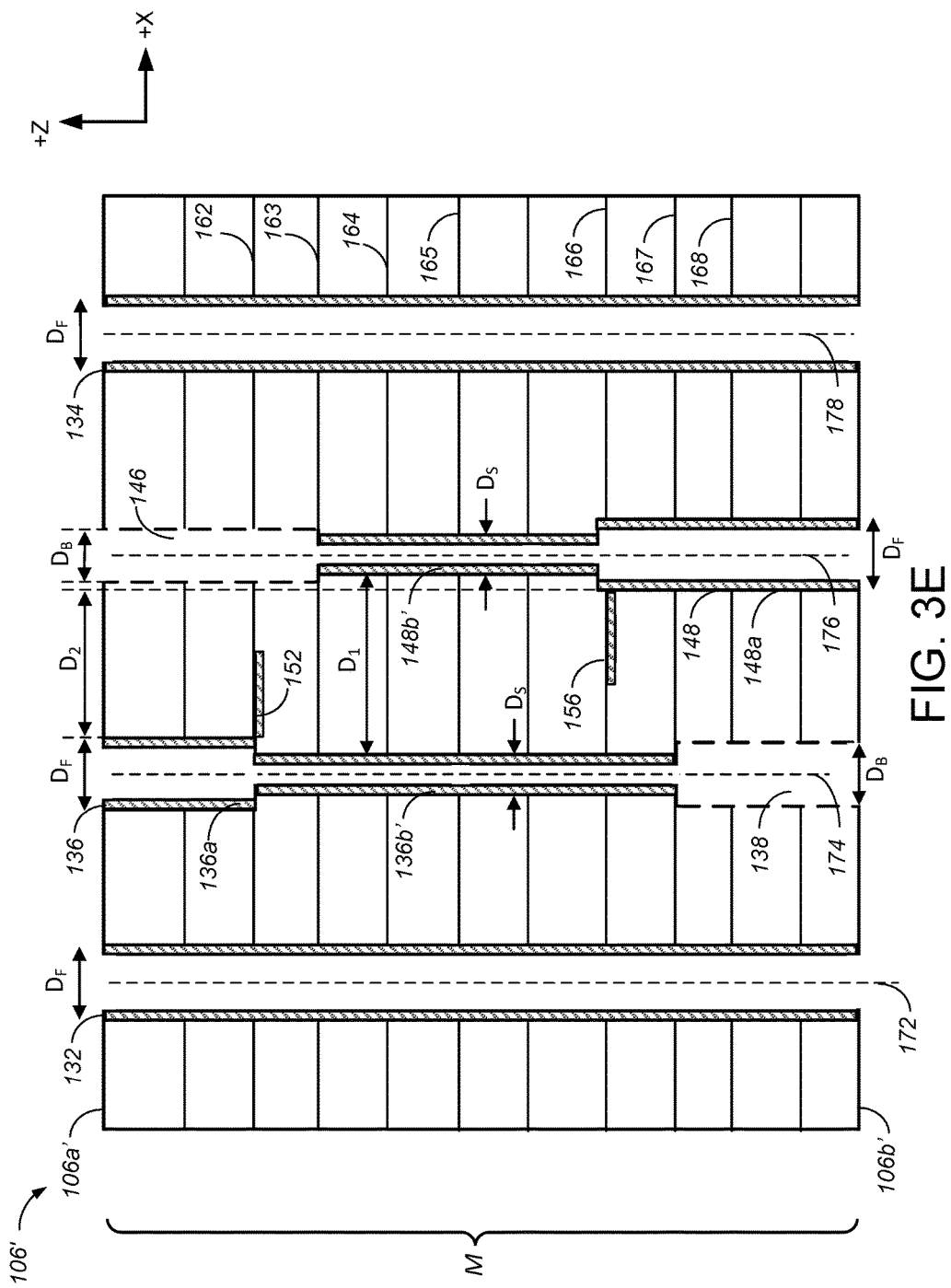

PRINTED CIRCUIT BOARD INCLUDING MULTI-DIAMETER VIAS

TECHNICAL FIELD

This specification relates to a printed circuit board (PCB) including dual-diameter vias.

BACKGROUND

An integrated circuit (IC) chip, such as an application-specific integrated circuit (ASIC) chip, can be attached to a PCB to establish electrical couplings with the PCB. Circuitry on the device formed by coupling the IC chip to the PCB together can be used to transfer data in data networks, data centers, and many other suitable applications through certain elements such as connectors. For high-speed applications, electrical couplings between the elements and the PCB may be established using belly-to-belly configuration. In a belly-to-belly configuration, a first element is coupled to one surface of the PCB and a second element is coupled to another surface of the PCB. To implement a belly-to-belly configuration, various techniques can be used. For example, a technique called "Sequential Lamination" is used to implement a belly-to-belly configuration. However, the "Sequential Lamination" technique is not cost-effective because it increases the number of process steps required to manufacture the PCB. As another example, a technique using laser drill vias is used to implement a belly-to-belly configuration. However, this technique is also not cost-effective because forming laser-drill vias is an expensive process.

SUMMARY

The present disclosure describes an apparatus including an IC and one or more elements such as connectors coupled to a PCB. The apparatus is any suitable packaged device or a part of a device, or a part of a system, including but not limited to: network switches, routers, servers, storage equipment, televisions, displays, super computers, desktop computers, laptop computers, tablets, and mobile devices such as smartphones, wearable devices, and media devices. The IC transmits and receives signals to or from one or more external devices or systems through elements, e.g., connectors, and a PCB. In some implementations, the IC receives and transmits signals without specifying particular external devices.

The IC transmits and/or receives signals having an amplitude between 50 millivolts (mV) and 5 volts (V) at a sampling rate between 1 gigabits per second (Gb/s) and 100 Gb/s through the elements, e.g., connectors. In some implementations, the IC transmits and/or receives signals having an amplitude between 50 mV and 5 V at a sampling rate between 100 Gb/s and 500 Gb/s through the elements, e.g., connectors. In some implementations, the amplitude of a receive signal is different from the amplitude of a transmit signal. In some implementations, the sampling rate of a receive signal is different from the sampling rate of a transmit signal. The amplitudes and the sampling rates of the IC as noted above are provided as illustrative examples and are not intended to limit different implementations to a particular range. Any suitable range of an amplitude and sampling rate can be used for different implementations.

The PCB acts as a conduit to transfer I/O signals including transmit signals, e.g., electrical signals sent from the IC chip to the external devices or systems, and receive signals, e.g., electrical signals sent from the external devices or systems to the IC chip. For example, the PCB acts as a host for the IC chip and connects the IC chip to one or more other IC chips hosted by other PCBs.

The elements such as connectors also act as conduits to transfer I/O signals including transmit signals and receive signals. For example, connectors are coupled to the PCB and transfer signals between the PCB and one or more external devices. To establish electrical couplings between the elements and the PCB, a belly-to-belly configuration can be used. Conventionally, one-size through-hole vias are formed in a PCB to enable physical and electrical couplings with contact pins of connectors. However, it is difficult to route differential pair traces between a signal via and a ground via while meeting PCB manufacturing requirements such as drill-to-metal or back-drill-to-metal constraints. In addition, because the one-size through-hole vias usually have a large diameter, a trace of a differential pair traces typically has to be routed separately on the PCB from the other trace in order to connect to the respective vias in the pin area, which may create phase errors between the differential pair traces or an impedance mismatch. Moreover, high speed signals of one element placed on one surface of a PCB and high speed signals of the other element placed on another surface of the PCB create crosstalk because of the proximity of vias to each other.

Comparing to the conventional one-size through-hole vias, according to one innovative aspect of the subject matter described in this specification, dual-diameter vias are formed in a PCB. Each dual-diameter via includes a wide portion formed on one side of a PCB and a narrow portion formed on the opposite side of a PCB at the same corresponding location as the wide portion. In particular, a wide portion of a particular via extends from a surface of the PCB to a signal layer that includes conductive traces to transfer signals between the PCB and the element coupled to the surface of the PCB. Moreover, a dual-diameter via that is adjacent to the particular via also includes a wide portion and a narrow portion. The wide portion of this via is adjacent to the narrow portion of the particular via and the narrow portion of this via is adjacent to the wide portion of the particular via. As a result, comparing the conventional one-size through-hole via, the distance between two adjacent vias is increased such that this arrangement of the dual-diameter vias reduces or eliminates crosstalk between signals transferred through the vias. In addition, to drill a narrow portion of a via, a small drill-bit can be used. Thus, damages to PCB traces that can occur during the drilling process can be reduced.

In general, one innovative aspect of the subject matter described in this specification can be implemented in an apparatus comprising: a printed circuit board (PCB) that includes: a multilayer lamination of one or more ground layers, one or more power layers, and a plurality of signal layers; a plurality of vias that pass through one or more layers of the multilayer lamination, wherein a first via of the plurality of vias includes: a first portion that has a first diameter, and a second portion that has a second diameter that is smaller than the first diameter, wherein a second via of the plurality of vias includes: a third portion that has a third diameter, and a fourth portion that has a fourth diameter that is smaller from the third diameter; and wherein the first portion of the first via is adjacent to the fourth portion of the second via and the second portion of the first via is adjacent to the third portion of the second via.

The foregoing and other implementations can each optionally include one or more of the following features, alone or in combination. In particular, one implementation includes all the following features in combination. The first diameter is between 0.5 mil and 30 mil and a difference between the first diameter and the second diameter is between 0.4 mil and 25 mil. The third diameter is between 0.5 mil and 30 mil and a difference between the third diameter and the fourth diameter is between 0.4 mil and 25 mil. The third diameter is different from the first diameter and the fourth diameter is different from the second diameter. The first via is coupled to a first signal layer of the plurality of signal layers and is configured to transfer a first signal. The first signal has an amplitude between 50 mV and 5 V. The first signal is transferred at a sampling rate between 1 Gb/s and 500 Gb/s. The first signal includes a pair of differential signals. The second via is coupled to a second signal layer of the plurality of signal layers and is configured to transfer a second signal. The second signal layer is a different signal layer from the first signal layer. The second signal has an amplitude between 50 mV and 5 V. The second signal is transferred at a sampling rate between 1 Gb/s and 500 Gb/s. The second signal includes a pair of differential signals. The apparatus further includes: a first element that is coupled to a first surface of the PCB; a second element that is coupled to a second surface of the PCB, the second surface being different from the first surface. The plurality of vias includes a plurality of via-in-pads. The first element includes a plurality of surface mount pads that are respectively coupled to the plurality of via-in-pads. The first signal is transferred from the PCB to the first element. The second signal is transferred from the second element to the PCB. The first portion of the first via extends from the first surface of the PCB to a first signal layer that includes conductive traces to transfer the first signal. The first via includes a back-drilled hole that extends from the second surface of the PCB to one end of the second portion of the first via. A diameter of the back-drilled hole is smaller than a diameter of the first portion of the first via. The third portion of the second via extends from the second surface of the PCB to a second layer that includes conductive traces to transfer a receive signal. The second via includes a back-drilled hole that extends from the first surface of the PCB to one end of the fourth portion of the second via. A diameter of the back-drilled hole is smaller than a diameter of the third portion of the second via.

In general, another innovative aspect of the subject matter described in this specification can be implemented in a network device comprising: an integrated circuit (IC); a PCB that includes: a multilayer lamination of one or more ground layers, one or more power layers, and a plurality of signal layers, and a plurality of vias that pass through one or more layers of the multilayer lamination, wherein a first via of the plurality of vias includes: a first portion that has a first diameter, and a second portion that has a second diameter that is smaller than the first diameter, wherein a second via of the plurality of vias includes: a third portion that has a third diameter, and a fourth portion that has a fourth diameter that is smaller from the third diameter, and wherein the first portion of the first via is adjacent to the fourth portion of the second via and the second portion of the first via is adjacent to the third portion of the second via; a first element that is configured to transfer the first signal from the IC and the PCB; a second element that is configured to transfer the second signal to the PCB and the IC.

The foregoing and other implementations can each optionally include one or more of the following features, alone or in combination. In particular, one implementation includes all the following features in combination. The network device is a router. The network device is a network switch.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

FIG. 2E is a diagram illustrating an example PCB of the apparatus in FIG. 2A.

FIG. 3E is a diagram illustrating an example PCB of the apparatus in FIG. 3A.

Like reference numbers and designations in the various drawings indicate like elements. It is also to be understood that the various exemplary embodiments shown in the figures are merely illustrative representations and are not necessarily drawn to scale.

DETAILED DESCRIPTION

Figure 1A:
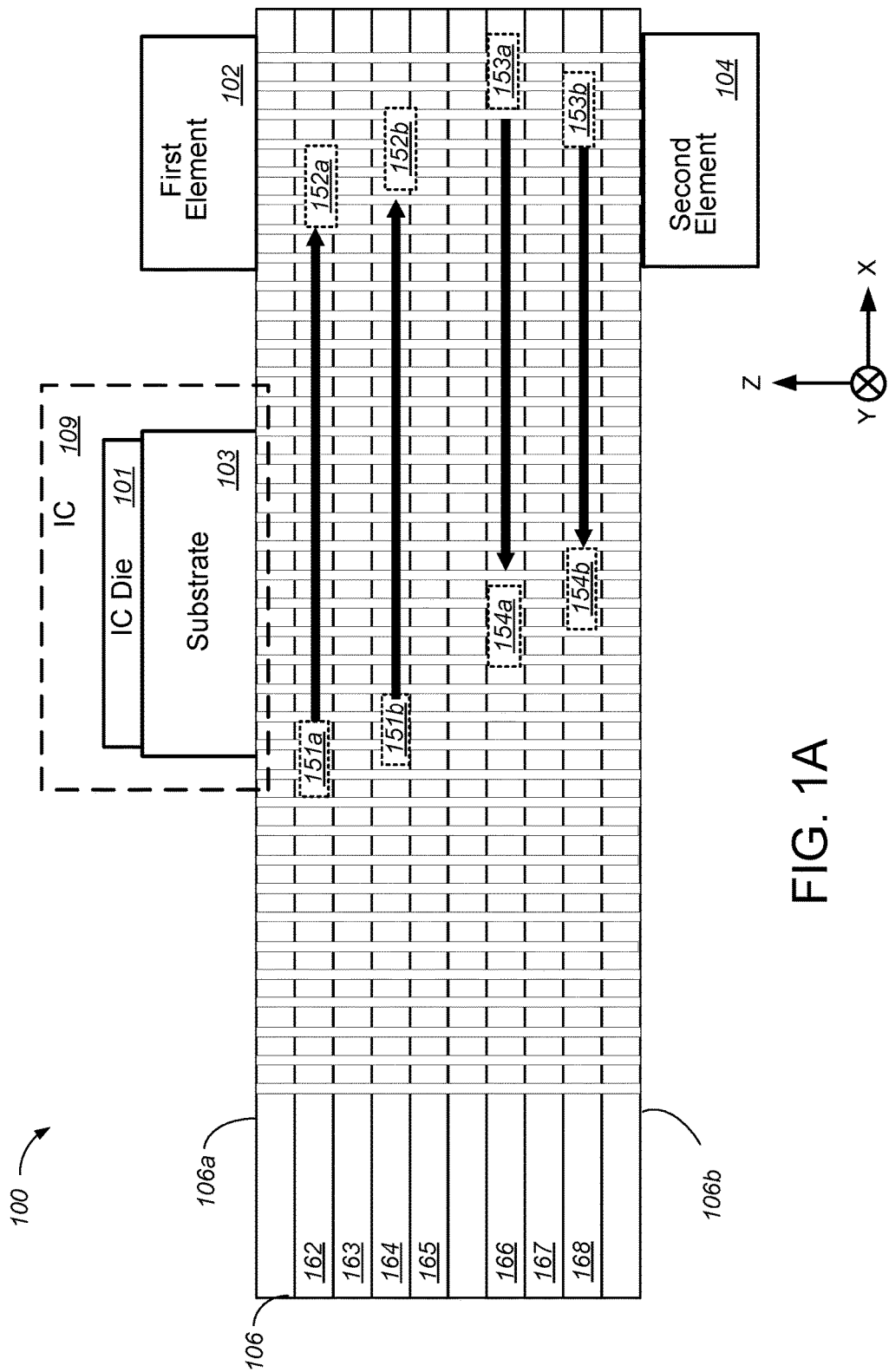
FIGS. 1A to 1C is a diagram illustrating an example apparatus including an IC, a PCB, and two elements.

FIG. 1A illustrates an example apparatus 100 that includes an IC 109, a first element 102, a second element 104, and a PCB 106. The apparatus 100 can be any suitable packaged device or a part of a device or a part of a system that supports a belly-to-belly configuration. As one example, the apparatus 100 is a network device, such as a network switch. As another example, the apparatus 100 is any suitable packaged device or part of a device, or part of a system, including but not limited to: routers, televisions, displays, desktop computers, laptop computers, tablets, and mobile devices such as smartphones, wearable devices, and media devices. In some implementations, the first element 102 and the second element 104 are connectors used in a network device. For example, in some implementations, the first element 102 and the second element 104 are zQuad Small Form-Factor Pluggable Plus (zQSFP+) connectors, QSFP-Double Density (QSFP-DD) connectors, or QSFP28 connectors that enable electrical or optical data communications in a network system. In some implementations, the first element 102 is of the same type as the second element 104. However, in other implementations, the first element 102 and the second element 104 are of different types.

The IC 109 includes one or more IC dies, a combination of IC dies or discrete components, or a system on chip (SoC). For example, the IC 109 can include an IC die 101. The IC die 101 in the IC 109 can be a silicon die that includes circuitry for one or more specific functions. In some implementations, the IC 109 includes one or more transmitters that generate, modulate, and/or output multi-channel signals. In some implementations, the IC 109 includes one or more receivers that receive, demodulate, and/or detect multi-channel signals from an external data path. In some implementations, the IC includes one or more transceivers that (i) generate, modulate and/or output signals and (ii) receive, demodulate, and/or detect signals from an external data path.

In some implementations, the IC 109 includes a substrate 103. The substrate 103 includes circuitry that establishes electrical couplings between the IC die 101 and the PCB 106. In some implementations, the substrate 103 includes a multilayer lamination of one or more ground layers, one or more power layers, or one or more signal layers. The IC die 101 may be flip-chip bonded or wire-bonded to the substrate 103. In some implementations, the substrate 103 is coupled to the PCB 106 through one or more pins. In some implementations, the substrate 103 is coupled to the PCB 106 through solder balls of a ball grid array.

In a belly-to-belly configuration, the first element 102 and the second element 104 are pressed against surfaces 106a and 106b of the PCB 106 respectively to establish an electrical coupling with the PCB 106. For example, the first element 102 and the second element 104 are pressed against the surface 106a and 106b of the PCB 106 through a Surface-Mount Technology (SMT), a press-fit pin technology, a clam-shell package technology, or any other suitable technology.

In some implementations, the first element 102 can be a connector. The connector can include any suitable termination to establish electrical coupling between the connector and the PCB 106. Examples of the terminations include surface mount pads and press-fit pins. The terminations of the first element 102 are configured to transfer signals between the first element 102 and the IC 109 through the PCB 106. In addition, the terminations of the first element 102 are coupled to the PCB 106 such that the first element 102 is securely fixed to the PCB 106. The coupling between the first element 102 and the PCB through pins are described in greater detail below with reference to FIGS. 2A and 2B.

Referring back to FIG. 1A, in some implementations, the second element 104 can be a connector. The connector can include any suitable termination to establish electrical coupling between the connector and the PCB 106. Examples of the terminations include surface mount pads and press-fit pins. The terminations of the second element 104 are configured to transfer signals between the second element 104 and the IC 109 through the PCB 106. In addition, the terminations of the second element 104 are coupled to the PCB 106 such that the second element 104 is securely fixed to the PCB 106.

The PCB 106 includes a multilayer lamination of one or more signal layers, one or more power layers, and one or more ground layers. For example, the PCB 106 includes M (where M is an integer >0) layers of circuitry, including signal layers, ground layers, and power layers. In some implementations, the PCB 106 includes up to 28 layers of circuitry (here M=28). However, the number of layers of circuitry is not limited to a particular number in different implementations. The PCB 106 can include any suitable number of layers of circuitry in various implementations. For example, in some implementations, the PCB 106 includes signal layers 162, 164, 166 and 168, ground layers 163 and 165, and a power layer 167. In some implementations, each layer of the multilayer lamination includes circuitry for one or more specific functions. For example, the signal layers 162, 164, 166 and 168 include conductive traces that provide a route to transfer signals.

Transmit signals are electrical signals transferred from an IC to one or more external devices through vias of a PCB, signal layers of the PCB, and an element, e.g., connector. For example, a transmit signal is transferred from the IC 109 to the via 151a through a ball grid array (BGA) ball. The signal layer 162 that is coupled to the via 151a transfers the transmit signal to the via 152a. The transmit signal is transferred from the via 152a to the first element 102 through the terminations of the first element 102, e.g., a surface mount pad or a press-fit pin. Then, the transmit signal is transferred from the first element 102 to the one or more external devices.

Receive signals are electrical signals transferred from one or more external devices to an IC in a reverse order. For example, a receive signal is transferred from one or more external devices to the second element 104. The receive signal is transferred from the second element 104 to the via 153a through the terminations of the second element 104, e.g., a surface mount pad or a press-fit pin. The signal layer 166 that is coupled to the via 153a transfers the receive signal from the via 153a to the via 154a. Then, the receive signal is transferred from the via 154a to the IC 109 through a BGA ball.

In some implementations, transmit signals are transferred as pairs of differential signals. A pair of differential transmit signals are transferred from an IC to one or more external devices through vias of a PCB, signal layers of the PCB, and an element, e.g., connector. For example, a pair of differential transmit signals are transferred from the IC 109 to the vias 151a and 151b through BGA balls. In some implementations, two non-adjacent signal layers are used to transfer a pair of differential transmit signals. For example, as illustrated in FIG. 1A, the signal layers 162 and 164 that are coupled to the vias 151a and 151b respectively transfer the transmit signals to the vias 152a and 152b respectively. In some implementations, two adjacent signal layers are used to transfer a pair of differential transmit signals. For example, the signal layers 162 and 163 can be respectively coupled to the vias 151a and 151b and respectively transfer the transmit signals from the vias 151a and 151b to the vias 152a and 152b. In some other implementations, a single layer can be used to transfer a pair of differential transmit signals. For example, the signal layer 162 can be coupled to both of the vias 151a and 151b and respectively transfer the transmit signals from the vias 151a and 151b to the vias 152a and 152b. Then, the transmit signals are respectively transferred from the vias 152a and 152b to the one or more external devices through the first element 102.

In some implementations, receive signals are transferred as pairs of differential signals. For example, a pair of differential receive signals are transferred from one or more external devices to the vias 153a and 153b through the second element 104. In some implementations, two non-adjacent signal layers are used to transfer a pair of differential receive signals. For example, as illustrated in FIG. 1A, the signal layers 166 and 168 that are coupled to the vias 153a and 153b respectively transfer the receive signals to the vias 154a and 154b respectively. In some implementations, two adjacent signal layers are used to transfer a pair of differential receive signals. For example, the signal layers 166 and 167 can be respectively coupled to the vias 153*a* and 153*b* and respectively transfer the receive signals respectively from the vias 153*a* and 153*b* to the vias 154*a* and 154*b*. In some other implementations, a single layer can be used to transfer a pair of differential receive signals. For example, the signal layer 166 can be coupled to both of the vias 153*a* and 153*b* and respectively transfer the receive signals from the vias 153*a* and 153*b* to the vias 154*a* and 154*b*. Then, the receive signals are transferred from the vias 154*a* and 154*b* to the IC 109 through BGA balls.

Figure 1B:
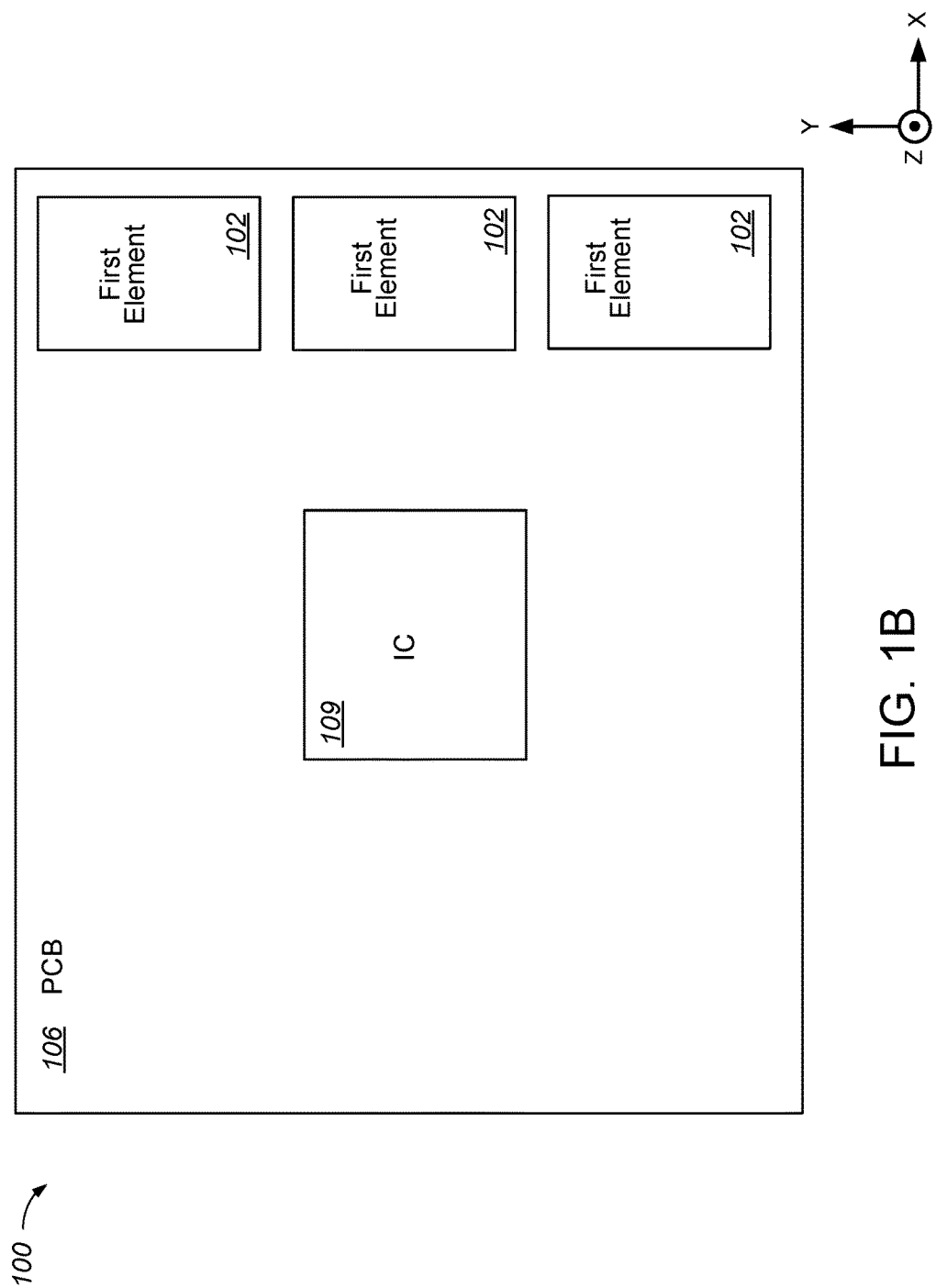
Figure 1C:
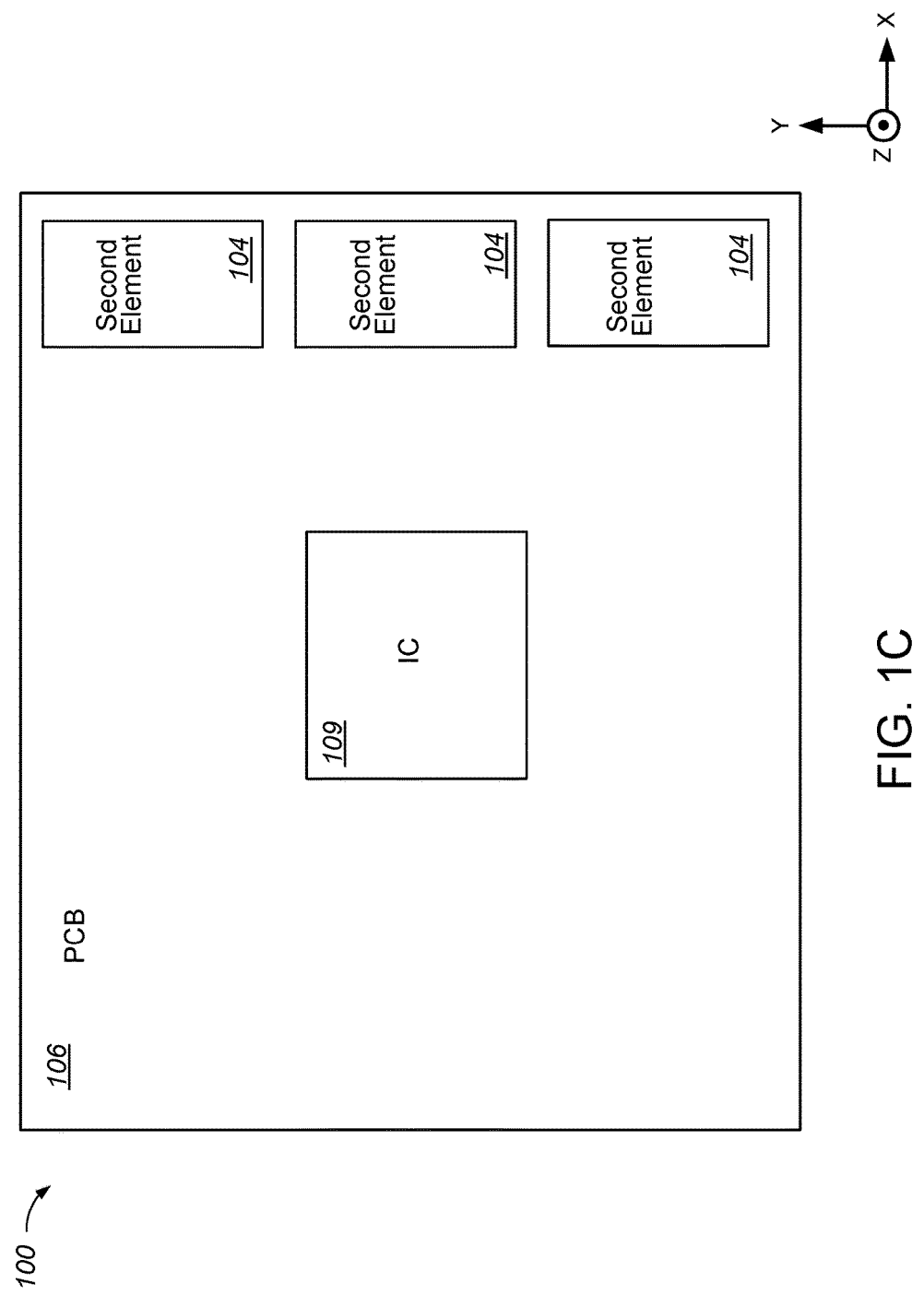

FIGS. 1B and 1C illustrate the example apparatus 100 in FIG. 1A in different views. For example, FIG. 1B illustrates the apparatus 100 in a top view and FIG. 1C illustrates the apparatus in a bottom view. In some implementations, the apparatus 100 includes multiple first elements 102 and multiple second elements 104. In particular, as shown in FIGS. 1B and 1C respectively, in some implementations, the first elements 102 and the second elements 104 are located in peripheral areas of the PCB 106 and the IC 109 is located in a central area of the PCB 106. In some implementations, the second elements 104 are located at the same corresponding locations as the first elements 102. However, the locations of the elements 102 and 104 and the IC 109 are not limited to particular locations. Any suitable locations can be used for the elements 102 and 104 and the IC 109 in various implementations. In this example, the PCB 106 is coupled to the IC 109 through BGA balls and is coupled to the elements 102 and 104 through surface mount pads or press-fit pins. However, in some other implementations, the PCB 106 is coupled to the IC 109 using any suitable coupling technology, e.g., surface mount pads.

Figure 2A:
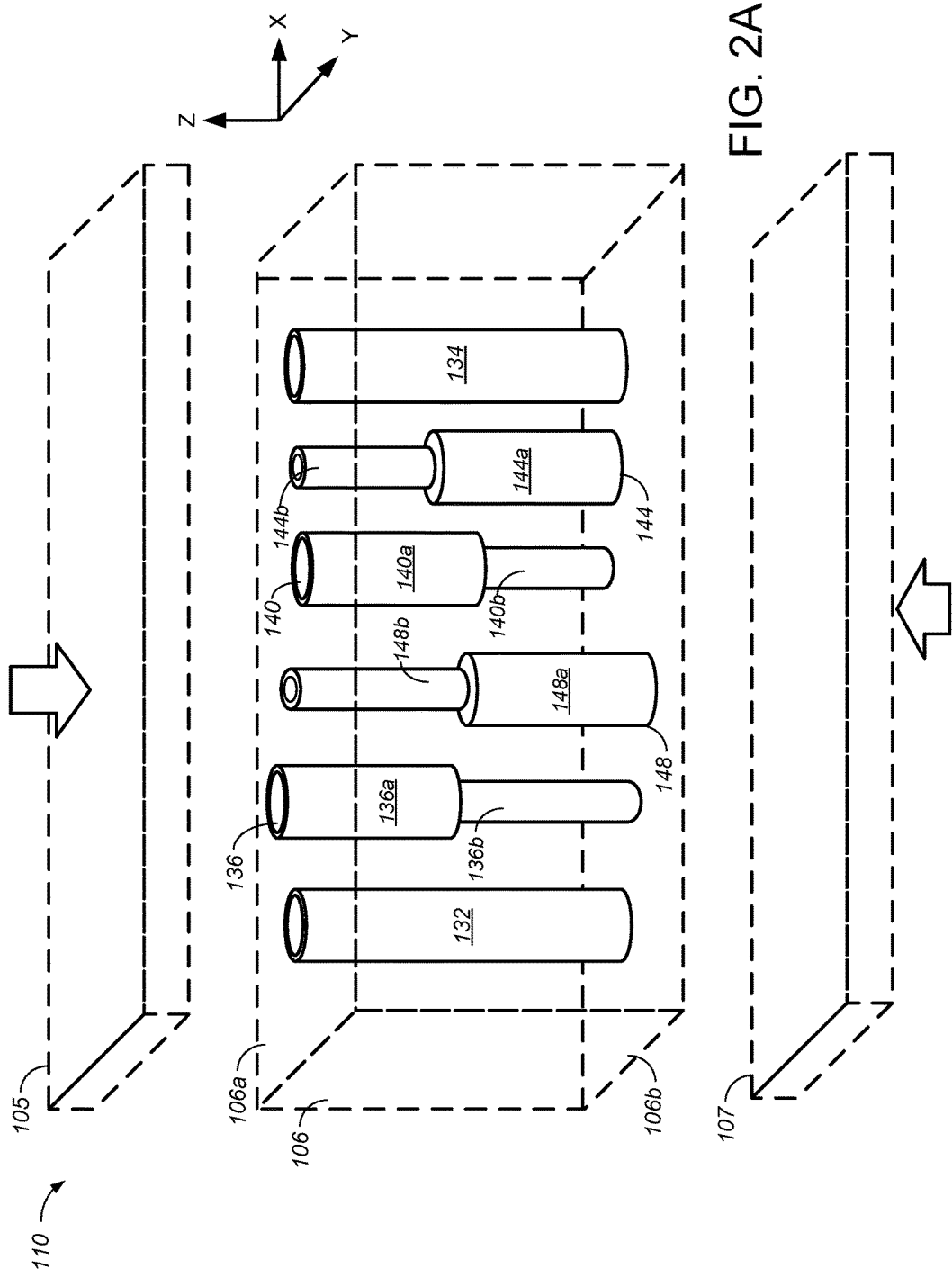
FIG. 2A is a diagram illustrating an example apparatus including a PCB and two elements.

FIG. 2A illustrates an example apparatus 110 including a PCB 106 and two elements 105 and 107. As shown, in some implementations, the apparatus 110, the first elements 105, and the second element 107 are respectively similar to the apparatus 100, the first elements 102, and the second element 104 described with reference to FIGS. 1A to 1C, with the apparatus 110 providing a different view of the apparatus 100 that does not show the IC 109. The PCB 106 includes multiple vias, such as 132, 134, 136, 140, 144 and 148. The vias 132, 134, 136, 140, 144 and 148 pass, fully or in part, through the PCB 106. The vias 136, 140, 144 and 148 can transfer transmit signals or receive signals between the elements 105, 107 and the PCB 106. The via 132 can be a ground via and the via 134 can be a power via.

In some implementations, the vias 136 and 140 transfer transmit signals from first element 105 to the PCB 106 and the vias 144 and 148 transfer receive signals from the PCB 106 to the second element 107. The vias 136, 140, 144, and 148 have dual diameters. Each of the vias 136, 140, 144, and 148 having dual diameters includes a first portion that has a first diameter and a second portion that has a second diameter. In some implementations, the first portion of a particular via is electrically coupled to the second portion of that particular via.

Figure 2B:
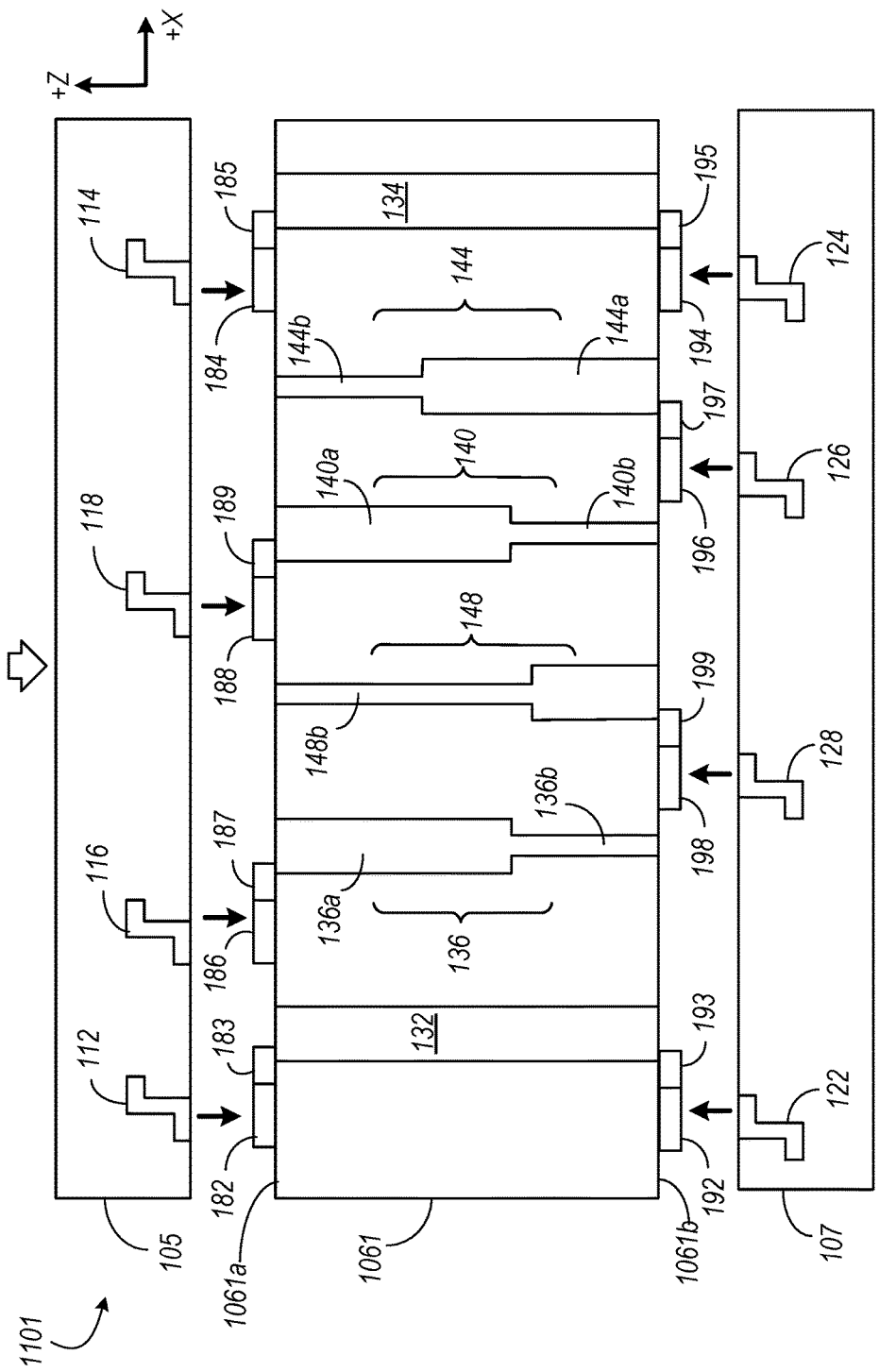
FIG. 2B is a diagram illustrating a cross-sectional view of an example apparatus including a PCB and two elements.

FIG. 2B illustrates a cross-sectional view of an example apparatus 1101 including a PCB 1061 and two elements 105 and 107. The PCB 1061 includes SMT pads and traces. The PCB 1061 is coupled to the elements 105 and 107 using the SMT pads and the traces. The first element 105 includes surface mount contacts to establish electrical coupling between the first element 105 and the PCB 1061 and the second element 107 includes surface mount contacts to establish electrical coupling between the second element 107 and the PCB 1061. For example, the first element 105 includes surface mount contacts 112, 114, 116, and 118 and the second element 107 includes surface mount contacts 122, 124, 126, and 128. The first element 105 and the second element 107 can include any suitable number of surface mount contacts.

The surface mount contacts of the first element 105 are respectively coupled to vias of the PCB 1061 using SMT pads that are coupled to a surface, e.g., the top surface, of the PCB 1061. For example, the surface mount contacts 112, 114, 116, and 118 of the first element 105 are respectively coupled to the SMT pads 182, 184, 186, and 188 that are coupled to the surface 1061*a* of the PCB 1061. The SMT pads 182, 184, 186, and 188 are respectively coupled to the vias 132, 134, 136, and 140 of the PCB 1061 through traces 183, 185, 187, and 189. In some implementations, the surface mount contacts of the first element 105 are evenly spaced in relation to each other. In some other implementations, the surface mount contacts of the first element 105 are unevenly spaced in relation to each other.

The surface mount contacts of the second element 107 are respectively coupled to vias of the PCB 1061 using SMT pads that are coupled to a surface, e.g., the bottom surface, of the PCB 1061. For example, the surface mount contacts 122, 124, 126, and 128 of the second element 107 are respectively coupled to the SMT pads 192, 194, 196, and 198 that are coupled to the surface 1061*b* of the PCB 1061. The SMT pads 192, 194, 196, and 198 are respectively coupled to the vias 132, 134, 144, and 148 of the PCB 1061 through traces 193, 195, 197, and 199. In some implementations, the surface mount contacts of the second element 107 are evenly spaced in relation to each other. In some other implementations, the surface mount contacts of the second element 107 are unevenly spaced in relation to each other. In this example, the vias of the PCB 1061 can be formed using any suitable technology.

Figure 2C:
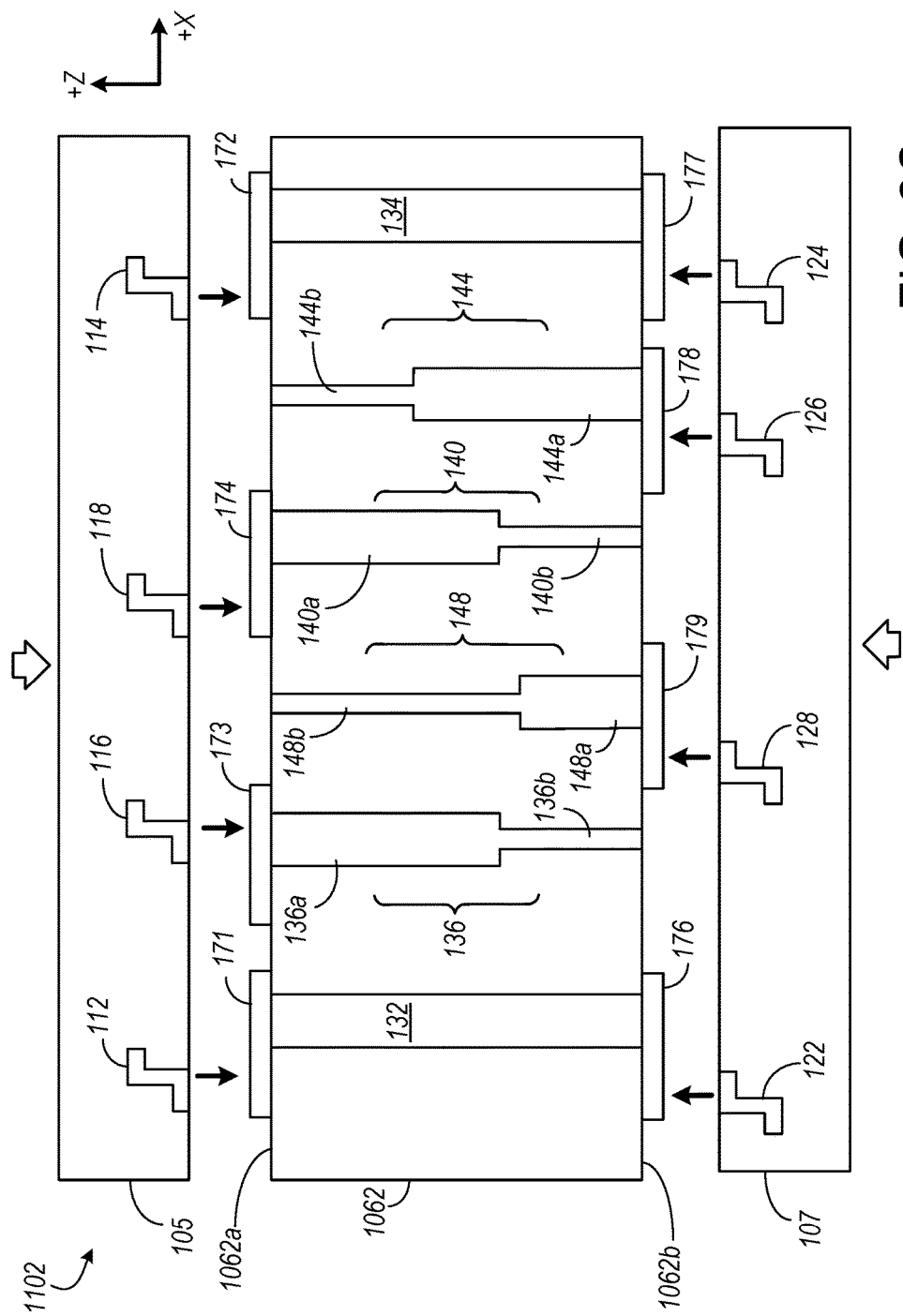
FIG. 2C is a diagram illustrating a cross-sectional view of another example apparatus including a PCB and two elements.

FIG. 2C illustrates a cross-sectional view of an example apparatus 1102 including a PCB 1062 and two elements 105 and 107. In this example, the vias of the PCB 1062 are formed using via-in-pad-plated-over (VIPPO) technology. The resulting vias formed using the VIPPO technology are vias-in-pads that are directly coupled to the surface mount contacts of the elements 105 and 107. For example, the vias-in-pads 171, 172, 173, and 174 are formed using the VIPPO technology and are respectively coupled to the surface mount contacts 112, 114, 116, and 118 of the first element 105. In addition, the vias-in-pads 176, 177, 178, and 179 are formed using the VIPPO technology and are respectively coupled to the surface mount contacts 122, 124, 126, and 128 of the second element 107.

Figure 2D:
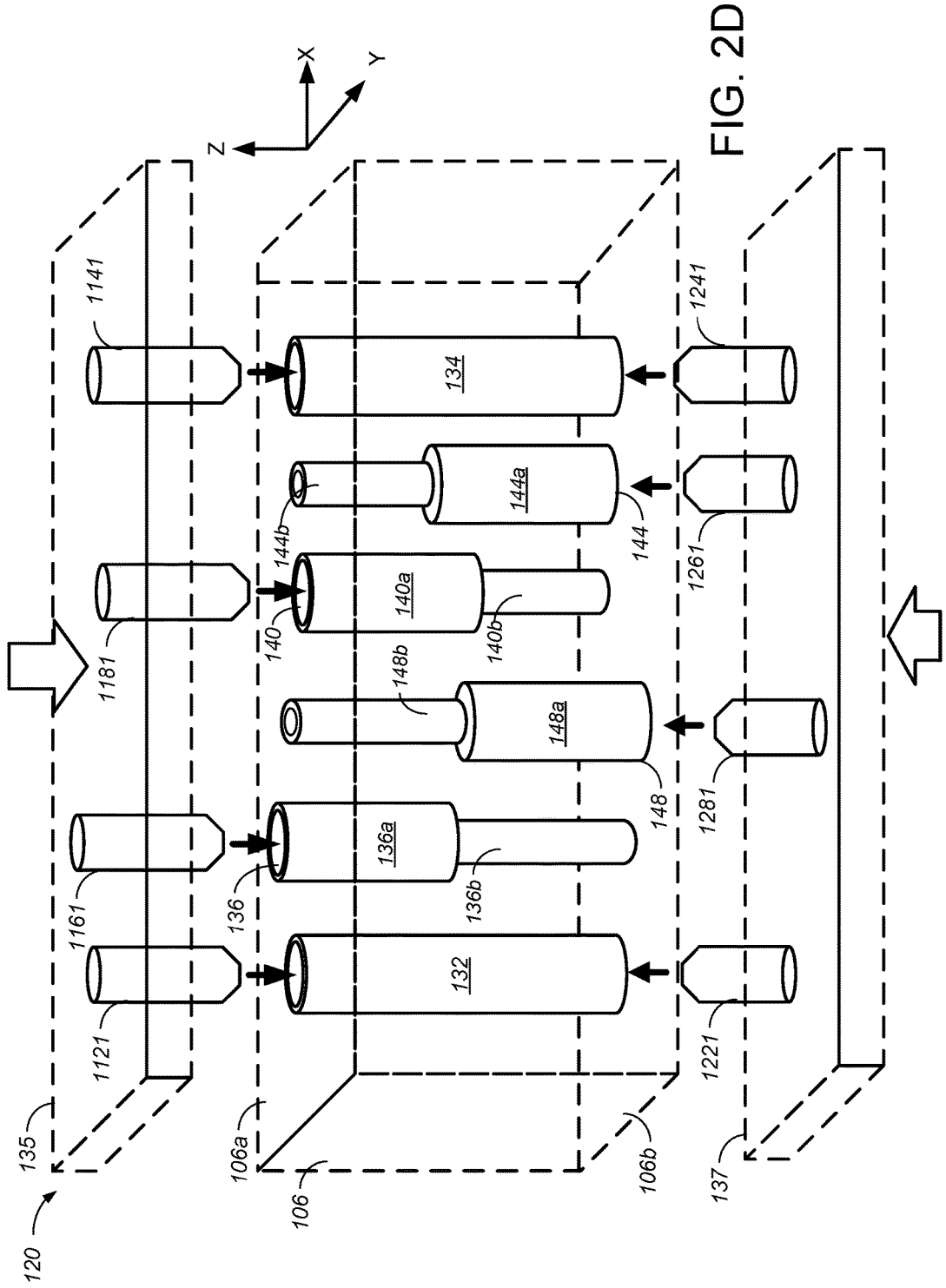
FIG. 2D is a diagram illustrating another example apparatus including a PCB and two elements.

FIG. 2D illustrates another example apparatus 120 including a PCB 106 and two elements 135 and 137. In some implementations, the apparatus 120 and the elements 135 and 137 are respectively similar to the apparatus 100, and the elements 102 and 104 described with reference to FIGS. 1A to 1C, with the apparatus 120 providing a different view of the apparatus 100 that does not show the IC 109. The PCB 106 includes multiple vias 132, 134, 136, 140, 144, and 148. The vias 132, 134, 136, 140, 144, and 148 pass, fully or in part, through the PCB 106.

The first element 135 includes contacts to establish electrical coupling between the first element 135 and the PCB 106. In FIG. 2D, the contacts of the first element 135 are press-fit pins. The pins of the first element 135 are respectively coupled to vias of the PCB 106. For example, the pins 1121, 1141, 1161, and 1181 of the first element 135 are respectively coupled to vias 132, 134, 136, and 140.

The second element 137 includes contacts to establish electrical coupling between the second element 137 and the PCB 106. In FIG. 2D, the contacts of the second element 137 are press-fit pins. The pins of the second element 137 are respectively coupled to vias of the PCB 106. For example, the pins 1221, 1241, 1261, and 1281 of the second element 137 are respectively coupled to vias 132, 134, 144, and 148.

FIG. 2E illustrates a cross-sectional view of an example PCB 106. In some implementations, the PCB 106 in FIG. 2E is similar to the PCB 106 described with reference to FIG. 2A. The PCB 106 includes a multilayer lamination of signal layers, one or more power layers, and one or more ground layers. For example, the PCB 106 includes M (where M is an integer >0) layers of circuitry, including signal layers, ground layers, and power layers. In some implementations, the PCB 106 includes up to 28 layers of circuitry (here M=28). However, the number of layers of circuitry is not limited to a particular number in different implementations. The PCB 106 can include any suitable number of layers of circuitry in various implementations. For example, the PCB 106 includes signal layers 162, 164, 166, and 168, ground layers 163 and 165, and a power layer 167. In this application, the layers 162-168 of the multilayer lamination represent conductive layers. In some implementations, one or more dielectric layers is coupled between two adjacent conductive layers of the multilayer lamination. For example, an epoxy layer can be coupled between two adjacent layers of the multilayer lamination.

In some implementations, each layer of the multilayer lamination includes circuitry for one or more specific functions. For example, the layer 162 includes conductive traces 152 that provide a route to transfer a transmit signal between the first element, e.g., the first element 105 or 135, and the PCB 106 through the via 136. As another example, the layer 166 includes conductive traces 156 that provide a different route to transfer a receive signal between the second element, e.g., the second element 107 or 137, and the PCB 106 through the via 148. As another example, the layer 167 includes conductive traces that provide a power signal, e.g., an analog power signal, to the first element and/or the second element through a via 134. As another example, the layers 163 and 165 includes conductive traces that provide a ground reference.

In some implementations, transmit signals are transferred through different signal layers. For example, the via 136 transfers one transmit signal from the first element through a signal layer 162 and the via 140 transfers another transmit signal from the first element through a signal layer 164. In some implementations, transmit signals are transferred through the same signal layer. For example, the vias 136 and 140 transfer respective transmit signals from the first element through the same signal layer 162.

In some implementations, receive signals are transferred through different signal layers. For example, the via 144 transfers one receive signal to the second element 137 through a signal layer 166 and the via 148 transfers another receive signal to the second element 137 through a signal layer 168. In some implementations, receive signals are transferred through the same signal layer. For example, the vias 144 and 148 transfer receive signals to the second element 137 through the same signal layer 168.

In some implementations, one or more ground layers that provides a ground path to ground are stacked above or below a signal layer. For example, the ground layer 163 is stacked between the signal layers 162 and 164 for transferring transmit signals. In particular, the signal layers 162 can transfer a pair of differential transmit signals. As another example, the ground layer 165 is stacked between the signal layer 164 for transferring a transmit signal and the signal layer 166 for transferring a receive signal. The ground layer electrically separates two signal layers. The ground layer can reduce or eliminate noise, e.g., crosstalk, that occurs between the signal layers.

The via 132 is a ground via. In some implementations, the ground via 132 is shared by two or more elements, e.g., the first element 105 and the second element 107 in FIG. 2A. In some other implementations, the ground via 132 is not shared by two or more elements. The ground via 132 is a through hole via having a cylindrical opening, which is formed about an axis 172 with a diameter of $D_F$. The diameter $D_F$ may be any value that is suitable for a design, an application, and manufacturability. For example, the diameter $D_F$ is between 0.5 and 30 mil or any other suitable value that a drill bit provides. In particular, to implement a PCB that can transfer as many I/O signals as possible, the PCB needs to have more vias to transfer the I/O signals. Thus, where the diameter $D_F$ is between 0.5 and 30 mil, the PCB can have enough number of vias to process the I/O signals for a network system.

The via 134 included in the PCB 106 is a power via. The via 134 is electrically coupled to a power source, e.g., an analog power source. In some implementations, the power via 134 is not shared by two or more elements. In some other implementations, the power via 134 is shared by two or more elements, e.g., the first element 105 and the second element 107 in FIG. 2A. The power via 134 is a through hole via having a cylindrical opening, which is formed about an axis 178 with a diameter of $D_F$. The diameter $D_F$ may be any value that is suitable for a design, an application, and manufacturability. For example, the diameter $D_F$ is between 0.5 and 30 mil or any other suitable value that a drill bit provides. In some implementations, the diameter of the ground via 132 is different from the diameter of the power via 134.

The PCB 106 include vias 136, 148 that have dual diameters. For example, the via 136 includes a first portion 136a and a second portion 136b. The first portion 136a and the second portion 136b are formed about an axis 174. The first portion 136a has a diameter $D_F$ and the second portion 136b has a diameter Ds. The diameter $D_F$ of the first portion 136a is larger than the diameter Ds of the second portion 136b. For example, the diameter $D_F$ is between 0.5 mil and 30 mil and the difference between the diameter $D_F$ and the diameter Ds is between 0.4 mil and 25 mil. Where the diameter $D_F$ is within the range, i.e., between 0.5 mil and 30 mil, and the difference is within the range, i.e., between 0.4 mil and 25 mil, the vias of the PCB 106 reduce or eliminate crosstalk between signals transferred through the vias.

The via 148 includes a first portion 148a and a second portion 148b. In this example, the first portion 148a has the diameter $D_F$ and the second portion 148b has the diameter Ds. The diameter $D_F$ of the first portion 148a is larger than the diameter Ds of the second portion 148b. In some implementations, the diameter of the first portion 148a is different from the diameter of the first portion 136a and the diameter of the second portion 148b is different from the diameter of the second portion 136b.

In some implementations, the first portion 136a of the via 136 extends from the surface 106a of the PCB 106 to the signal layer 162 that includes conductive traces 152 providing a route to transfer a transmit signal. The first portion 148a of the via 148 extends from the surface 106b of the PCB 106 to the signal layer 166 that includes conductive traces 156 providing a route to transfer a receive signal. In this example, the first portion 136a of the via 136 is adjacent to the second portion 148b of the via 148 and the second portion 136b of the via 136 is adjacent to the second portion 148a of the via 148. That is, the wide portion 136a of the via 136 is adjacent to the narrow portion 148b of the via 148 and the narrow portion 136b of the via 136 is adjacent to the wide portion 148a of the via 148. In this structure of the vias 136 and 148, the distance D1 between the wide portion 136a and the narrow portion 148b or between the narrow portion 136b and the wide portion 148a is larger than the distance D2 between the wide portion 136a and the wide portion 148a. Thus, this structure reduces or eliminates crosstalk between signals transferred through the vias 136, 148. Moreover, since the narrow portion 136b is narrower than the wide portion 136a, a small drill-bit can be used to form the narrow portion 136b. Thus, using a smaller drill-bit, damages to PCB traces or pads can be reduced.

In some implementations, the same or similar structure of the vias 136 and 148 is applied to the vias 140 and 144 in FIGS. 2A and 2B to reduce or eliminate crosstalk between signals transferred through the vias 140 and 144.

Figure 3A:
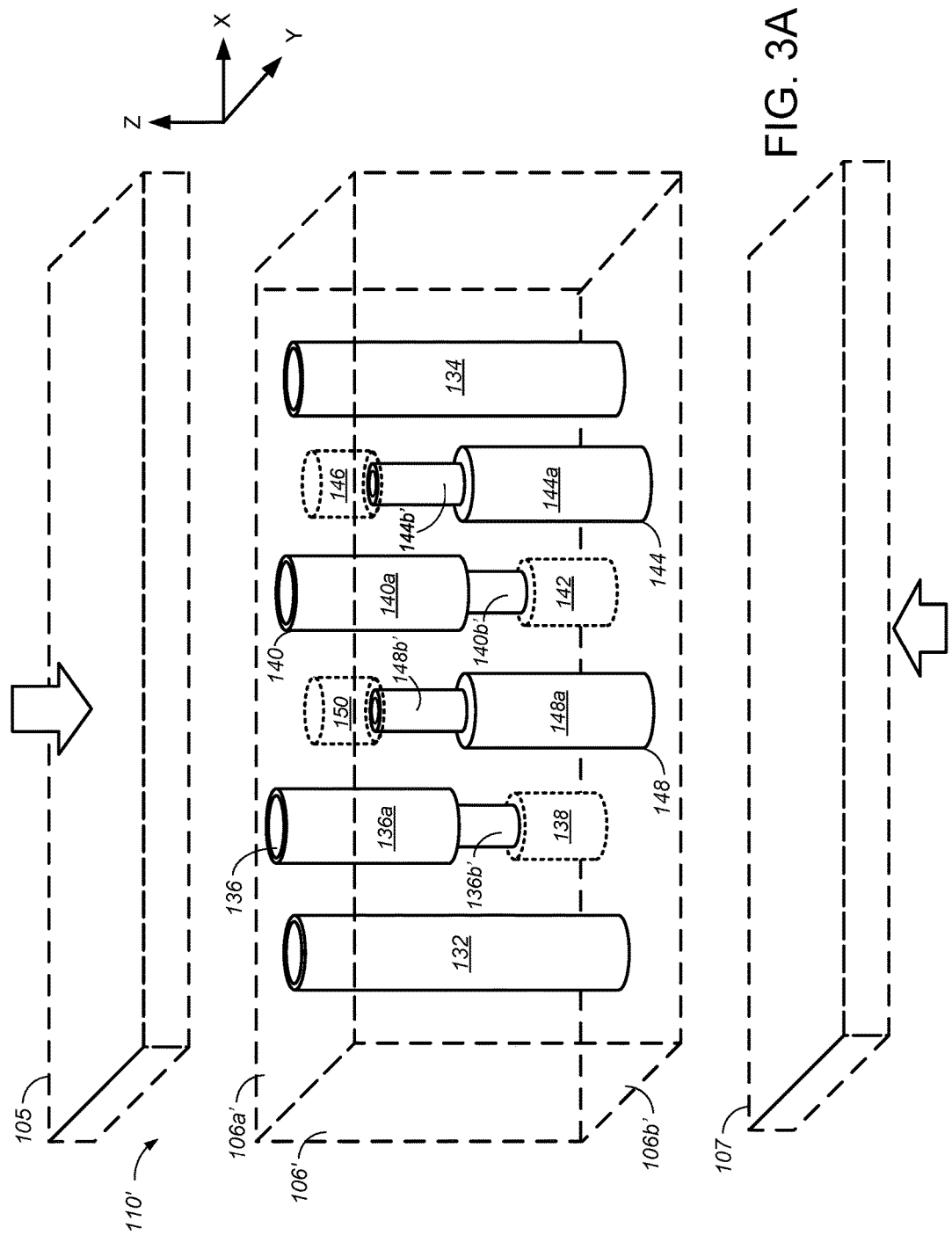
FIG. 3A is a diagram illustrating an example apparatus including a PCB and two elements.

FIG. 3A illustrates an example apparatus 110' including a PCB 106' and two elements 105 and 107. In some implementations, the apparatus 110' and the PCB 106' in FIG. 3A are similar to the apparatus 110 and the PCB 106 described with reference to FIG. 2A.

In FIG. 3A, the PCB 106' includes back-drilled holes. In some implementations, back-drilled holes are formed by a process, such as back drill or counter-boring, to remove portions of vias. In particular, the back-drilled holes are formed by removing portions, e.g., unused portions, of vias that transfer transmit signals or receive signals. For example, a back-drilled hole 138 is formed by removing a portion of the second portion 136b' to improve the quality of a transmit signal. The back-drilled hole 138 has a cylindrical opening. As another example, a back-drilled hole 146 is formed by removing a portion of the second portion 148b' to improve the quality of a receive signal. The back-drilled hole 146 has a cylindrical opening.

Figure 3B:
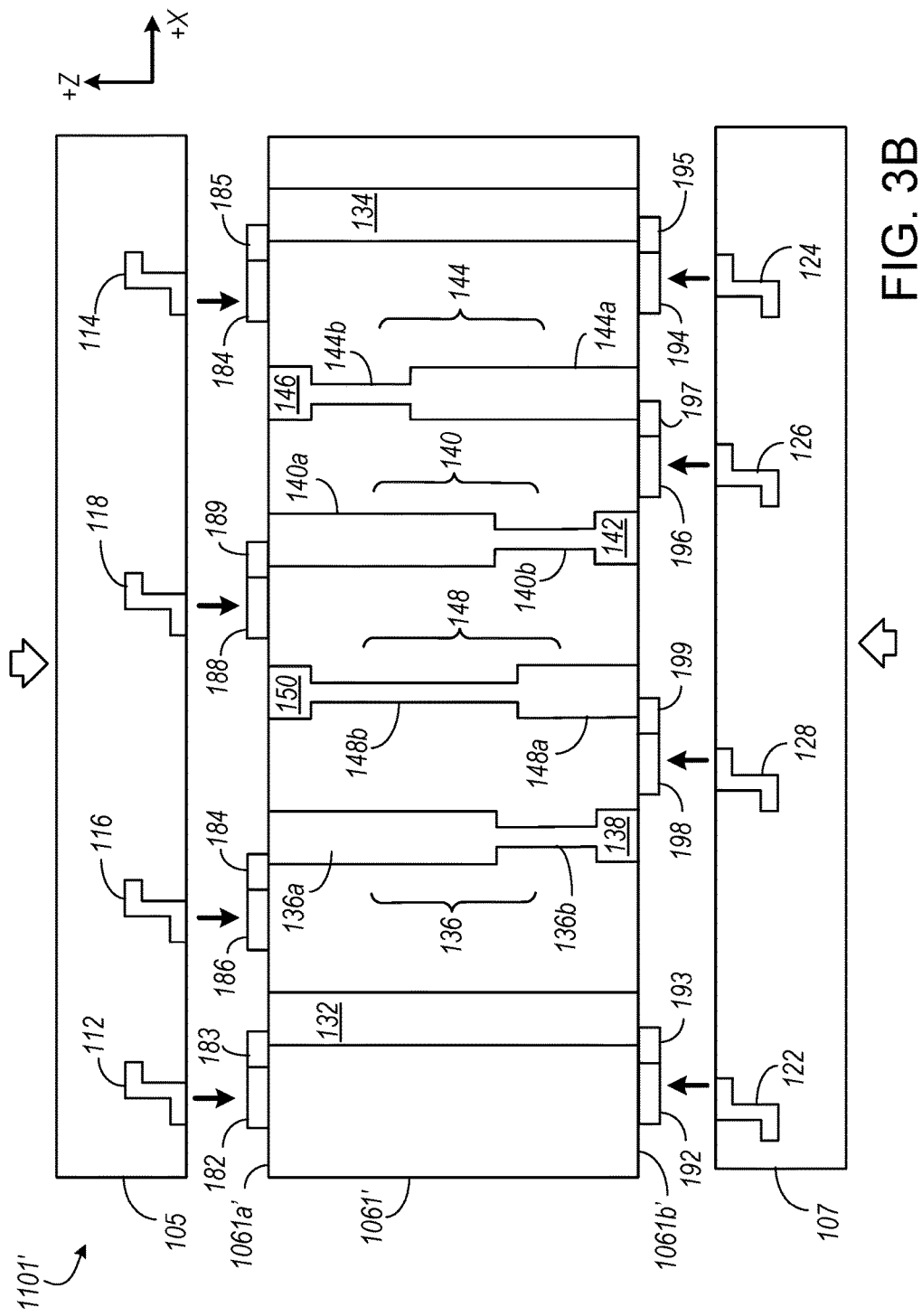
FIG. 3B is a diagram illustrating a cross-sectional view of an example apparatus including a PCB and two elements.

FIG. 3B illustrates a cross-sectional view of an example apparatus 1101' including a PCB 1061' and two elements 105 and 107. In some implementations, the apparatus 1101' and the PCB 1061' in FIG. 3B are similar to the apparatus 1101 and the PCB 1061 described with reference to FIG. 2B. In FIG. 3B, the PCB 1061' includes back-drilled holes. For example, back drilled holes 138 and 142 are respectively formed by removing portions of the second portions 136b' and 140b' to improve the quality of a transmit signal. The back-drilled hole 138 and 142 have cylindrical openings. As another example, back drilled holes 146 and 150 are respectively formed by removing portions of the second portions 144b' and 148b' to improve the quality of a receive signal. The back-drilled hole 146 and 150 have cylindrical openings.

Figure 3C:
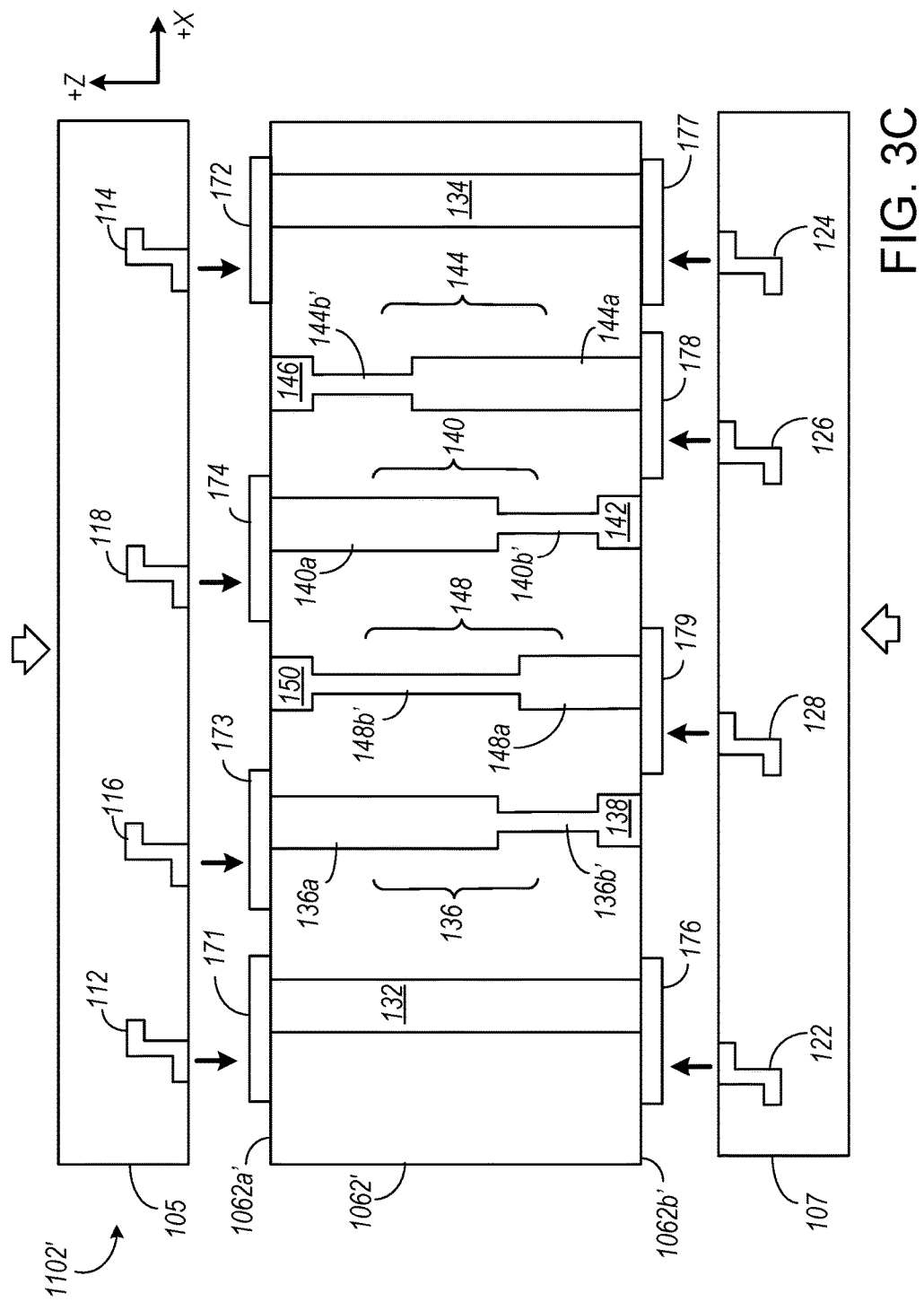
FIG. 3C is a diagram illustrating a cross-sectional view of another example apparatus including a PCB and two elements.

FIG. 3C illustrates a cross-sectional view of an example apparatus 1102' including a PCB 1062' and two elements 105 and 107. In some implementations, the apparatus 1102' and the PCB 1062' in FIG. 3C are similar to the apparatus 1102 and the PCB 1062 described with reference to FIG. 2C. In FIG. 3C, the PCB 1062' includes back-drilled holes. For example, back drilled holes 138 and 142 are respectively formed by removing portions of the second portions 136b' and 140b' to improve the quality of a transmit signal. The back-drilled hole 138 and 142 have cylindrical openings. As another example, back drilled holes 146 and 150 are respectively formed by removing portions of the second portions 144b' and 148b' to improve the quality of a receive signal. The back-drilled hole 146 and 150 have cylindrical openings.

Figure 3D:
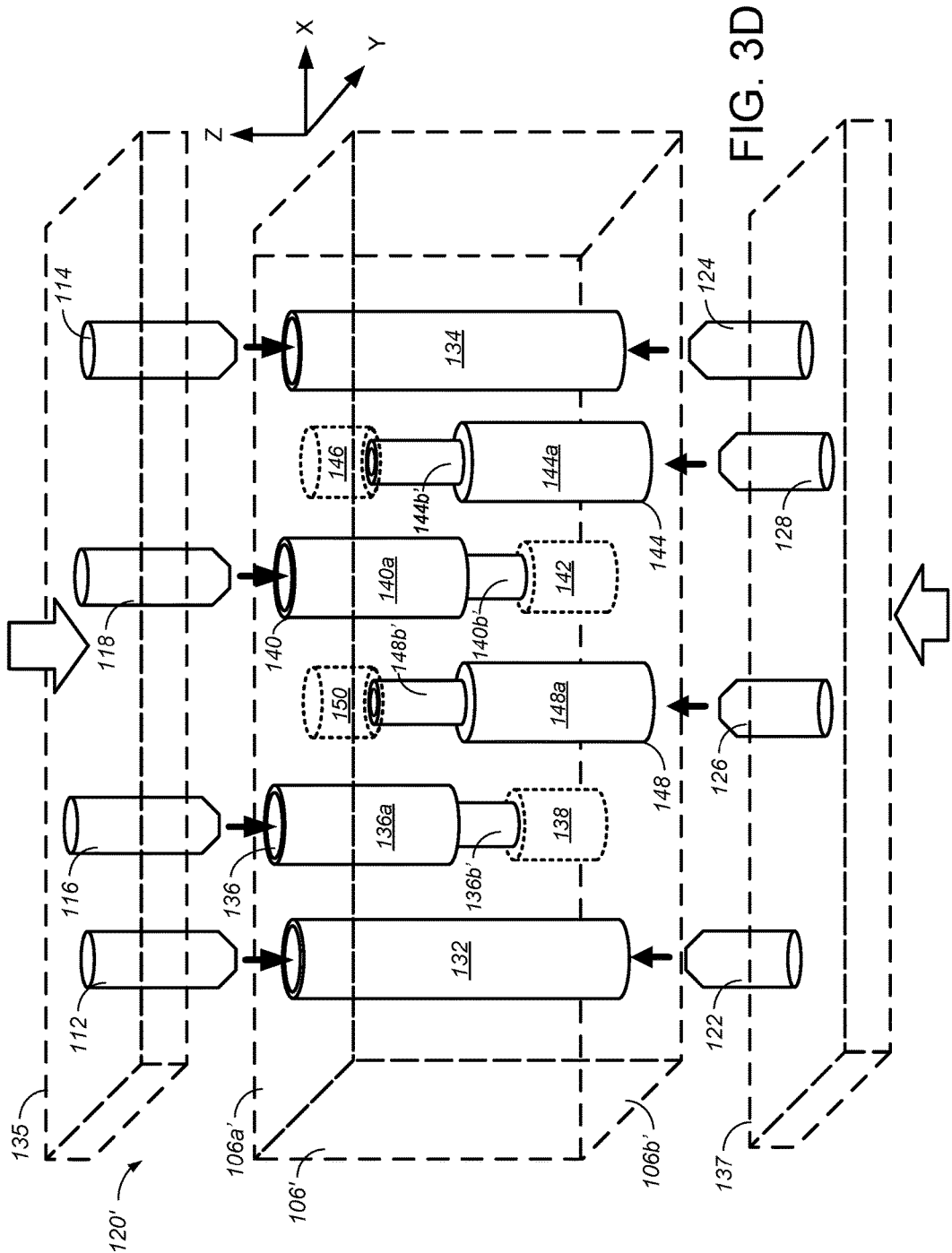
FIG. 3D is a diagram illustrating another example apparatus including a PCB and two elements.

FIG. 3D illustrates an example apparatus 120' including a PCB 106' and two elements 135 and 137. In some implementations, the apparatus 120' is similar to the apparatus 120 and the PCB 106 described with reference to FIG. 2D.

As shown in FIG. 3D, the PCB 106' includes back-drilled holes. In some implementations, back-drilled holes are formed by a process, such as back drill or counter-boring, to remove portions of vias. In particular, the back-drilled holes are formed by removing portions, e.g., unused portions, of vias that transfer transmit signals or receive signals. For example, a back-drilled hole 138 is formed by removing a portion of the second portion 136b' to improve the quality of a transmit signal. The back-drilled hole 138 has a cylindrical opening. As another example, a back-drilled hole 146 is formed by removing a portion of the second portion 148b' to improve the quality of a receive signal. The back-drilled hole 146 has a cylindrical opening.

FIG. 3E illustrates a cross-sectional view of the PCB 106'. In FIG. 3E, a back-drilled hole 138 is formed by removing a portion of the second portion 136b' to improve the quality of a transmit signal. The back-drilled hole 138 has a cylindrical opening that is formed about the axis 174 with a diameter of $D_B$. As another example, a back-drilled hole 146 is formed by removing a portion of the second portion 148b' to improve the quality of a receive signal. The back-drilled hole 146 has a cylindrical opening that is formed about the axis 176 with a diameter $D_B$.

In some implementations, the diameter $D_B$ is larger than the diameter Ds and smaller than the diameter $D_F$. Thus, comparing to a drill-bit for drilling a hole with a diameter $D_F$, a smaller drill-bit can be used to drill the holes 138 and 146 with the diameter $D_B$. Using a smaller drill bit, damages to adjacent dual-diameter vias, PCB traces, or pads during the back drilling process can be reduced. However, the diameter $D_B$ of the back-drilled holes are not limited to the range described above. The diameter $D_B$ can be selected based on different designs, applications, and manufacturability. For example, the diameter $D_B$ is between 6 mil and 16 mil or any other suitable value that a drill bit provides. Where the diameter $D_B$ is within the range, i.e., between 6 mil and 16 mil, the quality of signal transferred through the vias of the PCB 106' is improved.

In some implementations, referring to FIGS. 3A to 3D, the same or similar structure of back-drilled holes can be applied to the vias 140 and 144. That is, the back-drilled hole 142 is formed by removing a portion of the second portion 140b' of the via 140 to improve the quality of a transmit signal and the back-drilled hole 146 is formed by removing a portion of the second portion 144b' of the via 144 to improve the quality of a receive signal. In some implementations, the back-drilled holes 142 and 146 have the same diameter with the diameter $D_B$ of the back-drilled holes 138 and 142. In some implementations, the diameter of the back-drilled holes 142 and 146 is different from the diameter $D_B$ of the back-drilled holes 138 and 142.

Referring to FIG. 3E, in some implementations, the back-drilled holes are not formed in vias that are coupled to ground or a power source to save cost. For example, the vias 132 and 134 that are coupled to ground and a power source do not have back-drilled holes. However, in some other implementations, back-drilled holes are formed in vias that are coupled to ground or a power source. In some implementations, the back-drilled holes are non-conductive. Non-conductive back-drilled holes reduce signal reflection induced within the vias and improve the quality of the signals.

In some implementations, additional vias may be formed in the PCB 106 at suitable locations based on designs and applications. Moreover, although the wide portion and the narrow portion of a dual-diameter via are described as being formed about the same axis, an offset between the wide portion and the narrow portion may be introduced due to variability or tolerance in a manufacturing process or for some other reason. The variability or tolerance of the offset may be characterized through statistical techniques, and the descriptions in this specification related to the wide portion and the narrow portion of a dual-diameter via being formed about the same axis would encompass cases where an offset is introduced between the wide portion and the narrow portion. Similarly, although the dual-diameter via and the back-drilled hole are described as being formed about the same axis, an offset between the dual-diameter via and back-drilled hole also may be introduced. The variability or tolerance of the offset may be characterized through statistical techniques, and the descriptions in this specification related to the dual-diameter via and the back-drilled hole being formed about the same axis would encompass cases where an offset is introduced between the dual-diameter via and a back-drilled hole. Moreover, it is not required that an end of a wide portion or an end of a narrow portion be on the same plane as a surface of a PCB layer. For example, it is not required that the end of the wide portion be formed on the same plane as a bottom surface of the layer. The wide portion 136a may be drilled to stop within the PCB layer 162, and the narrow portion 136b may be drilled to be coupled to the wide portion 136a, where the end of the wide portion 136a and the end of the narrow portion 136b would meet on a plane inside the PCB layer 162 that is not the surface of the PCB layer 162.

Figure 4:
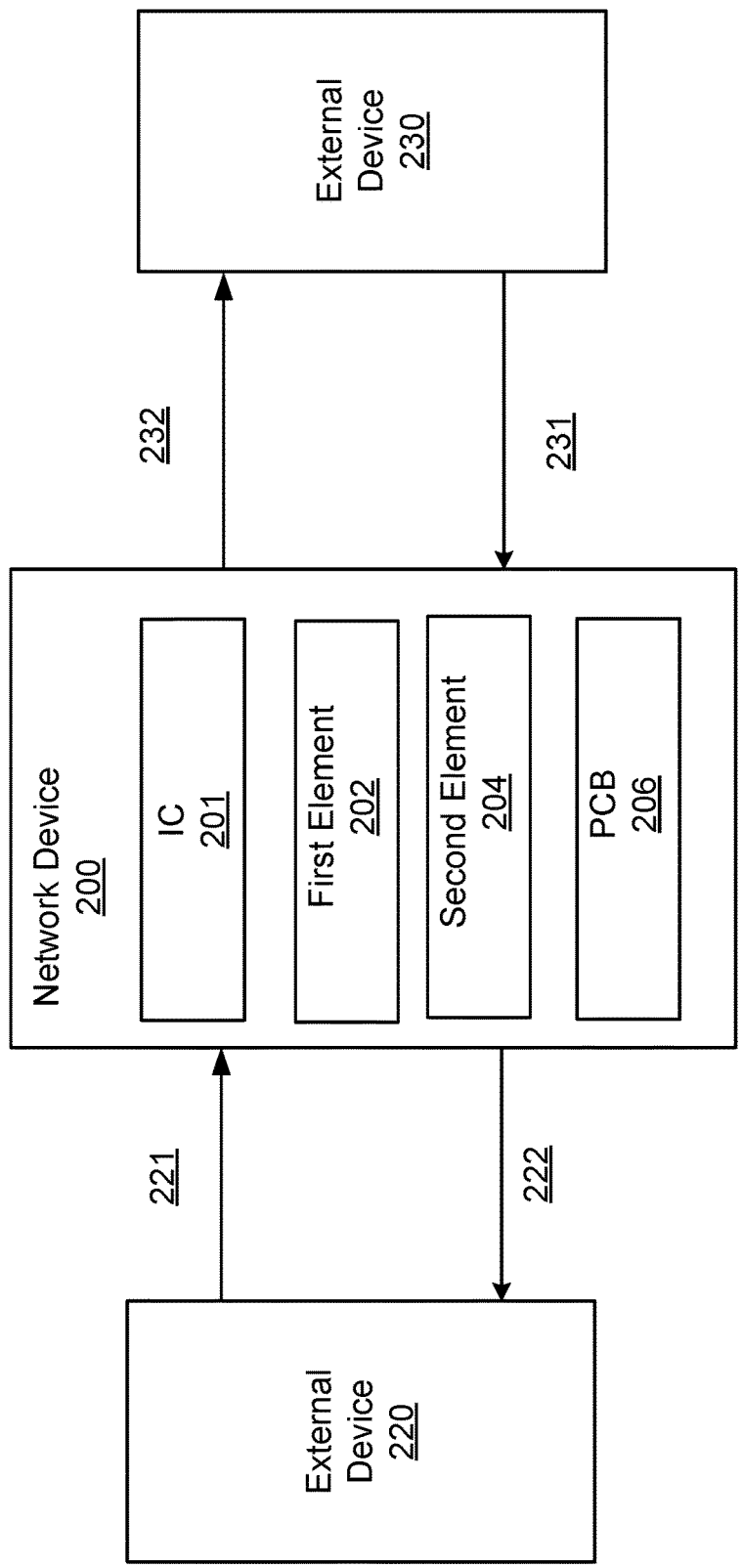
FIG. 4 is a diagram illustrating an example network device that includes an IC, a PCB, and two or more elements.

FIG. 4 illustrates an example network device coupled to one or more external devices. The network device 200 includes an IC 201, a first element 202, a second element 204, and a PCB 206. In some implementations, the network device 200 is the apparatus 100 described with reference to FIGS. 1A to 3B. For example, the network device includes a network switch and a router.

The network device 200 transmits and receives signals to or from one or more external devices, e.g., external devices 220, 230. In some implementations, the network 200 receives a signal 221 from the external device 220 through the second element 204 and transmits a signal 222 to the external device 220 through the first element 202. The receive signal 221 is transferred from the second element 204 to the IC 201 through the PCB 206. The IC 201 transmits the signal 222 to the first element 202 through the PCB 206. In some implementations, the network device 200 receives a signal 231 from the external device 230 and transmits a signal 232 to the external device 230. In some implementations, the network device 200 transmits a signal 232 to a different external device, e.g., 230, in response to the receive signal 221. In some implementations, the network device 200 transmits a signal without specifying a particular external device.

The PCB 206 acts as a conduit to transfer I/O signals including the transmit signals 222, 232 that are transferred from the IC 201 to the external devices 220, 230 or systems, and the receive signals 221, 231 that are transferred from the external devices 220, 230 or systems to the IC 201. For example, the PCB 206 acts as a host for the IC chip of the IC 201 and connects the IC chip to other one or more IC chips of ICs hosted by other PCBs of the external devices 220, 230.

The elements such as connectors also act as conduits to transfer I/O signals including transmit signals 222, 232 and receive signals 221, 231. For example, connectors are coupled to the PCB and transfer signals between the PCB 206 and one or more external devices, e.g., 220, 230.

As described above, the PCB 206 includes dual-diameter vias such that the PCB 206 reduces or eliminates crosstalk between signals transferred through the dual-diameter vias. Thus, the network device 200 including the PCB 206 can transfer I/O signals at a higher sampling rate without crosstalk, thereby enabling high speed signal processing. For example, the network device 200 transmits and receives signals having an amplitude between 50 mV and 5 V at a sampling rate between 1 Gb/s and 100 Gb/s. As another example, the network device 200 transmits and receives signals having an amplitude between 50 mV and 5 V at a sampling rate between 100 Gb/s and 500 Gb/s. In some implementations, a sampling rate of a receive signal is different from a sampling rate of a transmit signal. However, the amplitudes and the sampling rates of the signals are described as examples and are not limited to a particular range. Any suitable range of an amplitude and a sampling rate can be used for different implementations.

While this specification contains many specifics, these should not be construed as limitations, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination. Various implementations may have been discussed using two-dimensional cross-sections for easy description and illustration purpose. Nevertheless, the three-dimensional variations and derivations should also be included within the scope of the disclosure.

Similarly, while operations are depicted in the drawings in a particular order, this should not be understood as requiring that such operations be performed in the particular order shown or in sequential order, or that all illustrated operations be performed, to achieve desirable results.

Thus, particular embodiments have been described. Other embodiments are within the scope of the following claims. For example, the actions recited in the claims may be performed in a different order and still achieve desirable results.

What is claimed is:

1. An apparatus comprising:
   one or more connection elements that are configured to transfer signals; and
   a printed circuit board (PCB) that includes:
   a multilayer lamination of one or more ground layers, one or more power layers, and a plurality of signal layers,
   a plurality of vias that pass through one or more layers of the multilayer lamination,
   a plurality of traces that are distinct from the one or more connection elements, each trace of the plurality of traces being in contact with a respective via of the plurality of vias and being configured to transfer the signals,
a plurality of pads that are directly in contact with the one or more connection elements and that are configured to transfer the signals between the one or more connection elements and the plurality of traces,
wherein a first via of the plurality of vias includes:
a first portion that has a first diameter, and
a second portion that has a second diameter that is smaller than the first diameter,
wherein a second via of the plurality of vias includes:
a third portion that has a third diameter, and
a fourth portion that has a fourth diameter that is smaller from the third diameter,
wherein the first portion of the first via is adjacent to the fourth portion of the second via and the second portion of the first via is adjacent to the third portion of the second via,
wherein the one or more connection elements include:
a first element that is coupled to a first surface of the PCB, and
a second element that is coupled to a second surface of the PCB, the second surface being different from the first surface, and
wherein the first element includes a plurality of surface mount contacts that are respectively coupled to the plurality of pads.

2. The apparatus of claim 1, wherein the first diameter is between 0.5 mil and 30 mil, and
wherein a difference between the first diameter and the second diameter is between 0.4 mil and 25 mil.

3. The apparatus of claim 1, wherein the third diameter is between 0.5 mil and 30 mil, and wherein a difference between the third diameter and the fourth diameter is between 0.4 mil and 25 mil.

4. The apparatus of claim 1, wherein the third diameter is different from the first diameter and the fourth diameter is different from the second diameter.

5. The apparatus of claim 1, wherein the first via is coupled to a first signal layer of the plurality of signal layers and is configured to transfer a first signal.

6. The apparatus of claim 5, wherein the first signal has an amplitude between 50 mV and 5 V.

7. The apparatus of claim 5, wherein the first signal is transferred at a sampling rate between 1 Gb/s and 500 Gb/s.

8. The apparatus of claim 5, wherein the first signal includes a pair of differential signals.

9. The apparatus of claim 5, wherein the second via is coupled to a second signal layer of the plurality of signal layers and is configured to transfer a second signal.

10. The apparatus of claim 9, wherein the second signal layer is a different signal layer from the first signal layer.

11. The apparatus of claim 9, wherein the second signal has an amplitude between 50 mV and 5 V.

12. The apparatus of claim 9, wherein the second signal is transferred at a sampling rate between 1 Gb/s and 500 Gb/s.

13. The apparatus of claim 9, wherein the second signal includes a pair of differential signals.

14. The apparatus of claim 1, wherein a first signal is transferred from the PCB to the first element.

15. The apparatus of claim 1, wherein a second signal is transferred from the second element to the PCB.

16. The apparatus of claim 1, wherein the first portion of the first via extends from the first surface of the PCB to a first signal layer that includes first conductive traces to transfer the first signal.

17. The apparatus of claim 16, wherein the first via includes a back-drilled hole that extends from the second surface of the PCB to one end of the second portion of the first via.

18. The apparatus of claim 17, wherein a diameter of the back-drilled hole is smaller than a diameter of the first portion of the first via.

19. The apparatus of claim 1, wherein the third portion of the second via extends from the second surface of the PCB to a second layer that includes second conductive traces to transfer a receive signal.

20. The apparatus of claim 19, wherein the second via includes a back-drilled hole that extends from the first surface of the PCB to one end of the fourth portion of the second via.

21. The apparatus of claim 20, wherein a diameter of the back-drilled hole is smaller than a diameter of the third portion of the second via.

22. A network device comprising:
an integrated circuit (IC);
one or more connection elements that are configured to transfer signals; and
a PCB that includes:
a multilayer lamination of one or more ground layers, one or more power layers, and a plurality of signal layers,
a plurality of vias that pass through one or more layers of the multilayer lamination,
a plurality of traces that are distinct from the one or more connection elements, each trace of the plurality of traces being in contact with a respective via of the plurality of vias and being configured to transfer the signals, and
a plurality of pads that are directly in contact with the one or more connection elements and that are configured to transfer the signals between the one or more connection elements and the plurality of traces,
wherein a first via of the plurality of vias includes:
a first portion that has a first diameter, and
a second portion that has a second diameter that is smaller than the first diameter,
wherein a second via of the plurality of vias includes:
a third portion that has a third diameter, and
a fourth portion that has a fourth diameter that is smaller from the third diameter,
wherein the first portion of the first via is adjacent to the fourth portion of the second via and the second portion of the first via is adjacent to the third portion of the second via, and
wherein the one or more connection elements includes:
a first element that is configured to transfer a first signal from the IC and the PCB, the first element coupled to a first surface of the PCB;
a second element that is configured to transfer a second signal to the PCB and the IC, the second element coupled to a second surface of the PCB, the second surface being different from the first surface, and
wherein the first element includes a plurality of surface mount contacts that are respectively coupled to the plurality of pads.

23. The network device of claim 22, wherein the network device is a router.

24. The network device of claim 22, wherein the network device is a network switch.

25. The apparatus of claim 1, wherein the first via is electrically isolated from the second via.

26. The apparatus of claim 1, wherein each of the first via and the second via is coupled to a single pad of the plurality of pads.

* * * * *